United States Patent [19]

Hosaka et al.

[11] Patent Number: 5,215,857
[45] Date of Patent: Jun. 1, 1993

[54] 1,2-QUINONEDIAZIDE CONTAINING RADIATION-SENSITIVE RESIN COMPOSITION UTILIZING METHYL 2-HYDROXYPROPIONATE, ETHYL 2-HYDROXYPROPIONATE OR METHYL 3-METHOXYPROPIONATE AS THE SOLVENT

[75] Inventors: Yoshihiro Hosaka, Yokohama; Ikuo Nozue, Yokkaichi; Masashige Takatori, Yokohama; Yoshiyuki Harita, Kawasaki, all of Japan

[73] Assignee: Japan Synthetic Rubber Co., Ltd., Tokyo, Japan

[21] Appl. No.: 726,140

[22] Filed: Jul. 3, 1991

Related U.S. Application Data

[63] Continuation of Ser. No. 404,060, Sep. 8, 1989, abandoned, which is a continuation of Ser. No. 886,670, Jul. 18, 1986, abandoned.

[30] Foreign Application Priority Data

Aug. 7, 1985 [JP] Japan ................... 60-173396

[51] Int. Cl.$^5$ .......................... G03F 7/023; G03C 1/61
[52] U.S. Cl. ................................ 430/191; 430/165; 430/192; 430/193
[58] Field of Search ................. 430/191, 192, 193, 165

[56] References Cited

U.S. PATENT DOCUMENTS

| | | | |
|---|---|---|---|
| 3,869,292 | 3/1975 | Peters | 430/192 |
| 4,008,084 | 2/1977 | Ikeda et al. | 430/276 |
| 4,132,550 | 1/1979 | Bowman | |
| 4,164,421 | 8/1979 | Shinozaki et al. | 430/191 |
| 4,362,806 | 12/1982 | Whitmore | 430/7 |
| 4,421,841 | 12/1983 | Shimizu et al. | 430/285 |
| 4,477,553 | 10/1984 | Yamamoto et al. | 430/191 |
| 4,504,567 | 3/1985 | Yamamoto et al. | 430/191 |
| 4,550,069 | 10/1985 | Pampalone | 430/192 |
| 4,626,491 | 12/1986 | Gray | 430/191 |
| 4,626,492 | 12/1986 | Eilbeck | 430/191 |
| 4,639,406 | 1/1987 | Stahlhofen | 430/165 |
| 4,845,008 | 7/1989 | Nishioka et al. | 430/191 |

FOREIGN PATENT DOCUMENTS

| | | | |
|---|---|---|---|
| 177962 | 11/1986 | European Pat. Off. | |
| 2323170 | 1/1977 | France | |
| 1492529 | 11/1977 | United Kingdom | |
| 2023858 | 1/1980 | United Kingdom | 430/191 |
| 20233858 | 1/1980 | United Kingdom | 430/191 |

OTHER PUBLICATIONS

English language translation of French #2,323,170 Published Jan. 1977 (PDI-Tabet et al.).
Moreau, "Semiconductor Lithography," (1988).
DeForest, W. S., "Photoresist", McGraw-Hill Book Co., 1975, pp. 43-47, 59 and 132-136.
Salamy, T. E., Solvent Effects in Positive Photoresists, Electrochemical Society, Meeting, Hollywood, Fla., Oct. 19, 1989, 12 pages.
Semiconductor International, "1985 Master Buying Guide", pp. 70-77; Photoresists, 1985.
VLSI Technology, Ed. by Sze, McGraw-Hill Book Co., McGraw-Hill Series in Electrical Engineering, pp. 446 & 447, + Chapter 14 "Yield and Reliability", W. Bertram, 1983.
VLSI Electronics Microstructure Science, vol. 1, Chapt. 1, "Manufacturing Process Technology for MOS VLSI", F. W. Voltmer, pp. 1-37, 1981.
Semiconductor Lithography Principles, Practices and Materials, Wayne Moreau, pp. 918-919.
Standard Practive for Accellerated Aging of Photoresist (AJTM) pp. 527-529, 1982.

*Primary Examiner*—Charles L. Bowers, Jr.
*Assistant Examiner*—Christopher G. Young
*Attorney, Agent, or Firm*—Oblon, Spivak, McClelland, Maier & Neustadt

[57] ABSTRACT

A radiation-sensitive resin composition comprising a solution of an alkali-soluble resin and a radiation-sensitive compound in a solvent comprising a monooxymonocarboxylic acid ester. This composition has a high storage stability (i.e., a very small amount of fine particles are formed during storage) and is suited for use as a resist for making integrated circuits.

8 Claims, No Drawings

1,2-QUINONEDIAZIDE CONTAINING RADIATION-SENSITIVE RESIN COMPOSITION UTILIZING METHYL 2-HYDROXYPROPIONATE, ETHYL 2-HYDROXYPROPIONATE OR METHYL 3-METHOXYPROPIONATE AS THE SOLVENT

This application is a continuation of application Ser. No. 07/404,060, filed on Sep. 8, 1989, now abandoned, which is a continuation of application Ser. No. 06/886,670, filed on Jul. 18, 1986, now abandoned.

BACKGROUND OF THE INVENTION

1. Field of the Invention

This invention relates to a radiation-sensitive resin composition comprising a solution of an alkali-soluble resin and a radiation-sensitive compound dissolved in a solvent, which composition is sensitive to radiations such as ultraviolet rays, far-ultraviolet rays, X-rays, electron beams, molecular beams, gamma-rays, synchrotron radiations, proton beams and the like.

2. Description of the Invention

The resist compositions currently used in making integrated circuits comprises an alkali-soluble resin and a radiation-sensitive compound, and more specifically known are (a) positive type resist compositions comprising an alkali-soluble resin and a 1,2-quinonediazide compound and (b) negative type resist compositions comprising an alkali-soluble resin and an azide compound.

When these resist compositions comprising an alkali-soluble resin and a radiation-sensitive compound are exposed to a radiation through a mask and then subjected to development with a developer consisting of an aqueous alkaline solution, the exposed portions in the case of the positive type resist compositions or the non-exposed portions in the case of the negative type resist compositions are dissolved in the developer, whereby a resist pattern which is faithful to the mask and has a high resolution is obtained. Therefore, resist compositions comprising an alkali-soluble resin, which are excellent in resolution, have been often used in recent years during which higher integration of integrated circuits has been demanded.

However, resist compositions comprising a solution of an alkali-soluble resin and a radiation-sensitive compound in a solvent have the following drawbacks: When the resist compositions are filtered through a filter having a pore diameter of, for example, 0.2 μm and then allowed to stand, it happens in some cases that fine particles which are too fine to observe visually are formed in the compositions, and when the compositions containing the resulting fine particles are further stored for a long period of time, precipitation comes to be observed. In such resist compositions, the fine particles have, in some cases, a particle diameter of at least 0.5 μm. When a resist composition containing fine particles having such a large particle diameter is used to form a resist pattern of about 1 μm on a wafer, the fine particles remain at the substrate portion where the resist is removed by development, resulting in a reduction of resolution. Further, when a substrate is etched through a resist pattern formed from a resist composition containing such fine particles, pin holes appear also at the substrate portion covered with the resist pattern, resulting in a reduction of yield in the manufacture of integrated circuits.

SUMMARY OF THE INVENTION

This invention aims at solving the above-mentioned problems to provide a radiation-sensitive resin composition which is very low in formation of fine particles and suited for use as a resist.

According to this invention, there is provided a radiation-sensitive resin composition comprising a solution of an alkali-soluble resin and a radiation-sensitive compound in a solvent, characterized in that the solvent comprises a monooxymonocarboxylic acid ester.

DETAILED DESCRIPTION OF THE INVENTION

The monooxymonocarboxylic acid ester used as the solvent in this invention is preferably a compound represented by the formula (I):

$$R^1O-R^2-COOR^3 \tag{I}$$

wherein $R^1$ is a hydrogen atom, an alkyl group having 1 to 3 carbon atoms or an acyl group having 1 to 4 carbon atoms; $R^2$ is an alkylene group having 1 to 4 carbon atoms; and $R^3$ is an alkyl group having 1 to 4 carbon atoms.

Specific examples of the monooxymonocarboxylic acid ester include alkyl oxyacetates such as methyl hydroxy acetate, ethyl hydroxyacetate, butyl hydroxyacetate and the like; alkyl alkoxyacetates such as methyl methoxyacetate, ethyl methoxyacetate, butyl methoxyacetate, methyl ethoxyacetate, ethyl ethoxyacetate and the like; alkyl 3-hydroxypropionates such as methyl 3-hydroxypropionate, ethyl 3-hydroxypropionate and the like; alkyl 3-alkoxypropionates such as methyl 3-methoxypropionate, ethyl 3-methoxypropionate and the like; alkyl 2-hydroxypropionates such as methyl 2-hydroxypropionate, ethyl 2-hydroxypropionate, propyl 2-hydroxypropionate and the like; alkyl 2-alkoxypropionates such as ethyl 2-methoxypropionate, propyl 2-methoxypropionate, methyl 2-ethoxypropionate, ethyl 2-ethoxypropionate and the like; alkyl 2-hydroxy-2-methyl propionates such as methyl 2-hydroxy-2-methylpropionate, ethyl 2-hydroxy-2-methylpropionate and the like; alkyl 2-alkoxy-2-methylpropionates such as methyl 2-methoxy-2-methylpropionate, methyl 2-ethoxy-2-methylpropionate and the like; alkyl 2-hydroxypropionate-3-methylbutanoates such as methyl 2-hydroxy-3-methylbutanoate, ethyl 2-hydroxy-3-methylbutanoate and the like; and alkyl 2-alkoxy-3-methylbutanoates such as methyl 2-methoxy-3-methylbutanoate, methyl 2-ethoxy-3-methylbutanoate, ethyl 2-ethoxy-3-methylbutanoate and the like. Alkyl 2-hydroxypropionates are preferred, and methyl 2-hydroxypropionate and ethyl 2-hydroxypropionate are particularly preferred. These monooxymonocarboxylic acids may be used alone or in combination of two or more.

In this invention, the solvent may be a mixture of the monooxymonocarboxylic acid ester and at least one other solvent in an amount of, for example, less than 70% by weight, preferably less than 50% by weight and more preferably less than 30% by weight, based on the weight of the mixture. Most preferably, only the monooxymonocarboxylic acid esters are used as the solvent.

In this invention, the content of the solvent comprising a monooxymonocarboxylic acid ester in the radiation-sensitive resin composition is usually 40 to 90%, preferably 50 to 85%, by weight based on the weight of the composition.

Said other solvent includes ethers such as ethylene glycol monomethyl ether, ethylene glycol monoethyl ether, diethylene glycol monomethyl ether, diethylene glycol monoethyl ether, benzyl ethyl ether, dihexyl ether and the like; esters such as methyl cellosolve acetate, ethyl cellosolve acetate, ethyl acetate, butyl acetate, benzyl acetate, ethyl benzoate, diethyl oxalate, diethyl maleate, ethylene carbonate, propylene carbonate, γ-butyrolactone and the like; ketones such as methyl ethyl ketone, cyclohexanone, diisobutyl ketone, acetonylacetone, isophorone and the like; fatty acids such as caproic acid, capric acid and the like; alcohols such as 1-octanol, 1-nonanol, benzyl alcohol and the like; aromatic hydrocarbons such as toluene, xylene and the like; and so forth. These solvents may be used alone or in combination of two or more.

Typical examples of the alkali-soluble resin used in this invention are alkali-soluble novolak resins (hereinafter referred to simply as "novolaks"). These novolaks can be obtained by subjecting a phenol and an aldehyde to addition condensation in the presence of an acid catalyst.

The phenol includes, for example, phenol, o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 3,4-xylenol, 3,5-xylenol, 2,3,5-trimethylphenol, p-phenylphenol, hydroquinone, catechol, resorcinol, 2-methylresorcinol, pyrogallol, α-naphthol, bisphenol A, dihydroxybenzoic acid esters and gallic acid esters. Preferred as these compounds are phenol, o-cresol, m-cresol, p-cresol, 2,5-xylenol, 3,5-xylenol, 2,3,5-trimethylphenol, resorcinol, 2-methylresorcinol and bisphenol A. These phenols may be used alone or in combination of two or more.

The aldehyde includes, for example, formaldehyde, paraformaldehyde, acetaldehyde, propyl aldehyde, benzaldehyde, phenylacetaldehyde, α-phenylpropyl aldehyde, β-phenylpropyl aldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde and p-n-butylbenzaldehyde. Preferred as these compounds are formaldehyde, acetaldehyde and benzaldehyde. These aldehydes may be used alone or in combination of two or more.

The aldehyde is usually used in an amount of 0.7 to 3 moles, preferably 0.7 to 2 moles, per mole of the phenol.

As the acid catalyst, there may be used an inorganic acid such as hydrochloric acid, nitric acid, sulfuric acid or the like, or an organic acid such as formic acid, oxalic acid, acetic acid or the like. The acid catalyst is preferably used in an amount of $1 \times 10^{-4}$ to $5 \times 10^{-1}$ mole per mole of the phenol.

In the condensation reaction, water is usually used as a reaction medium. However, when the phenol is not dissolved in an aqueous aldehyde solution, resulting in a heterogeneous reaction system at beginning of the reaction, a hydrophilic solvent may be used as a reaction medium.

The hydrophilic solvent used in this case includes, for example, alcohols such as methanol, ethanol, propanol, butanol and the like, and cyclic ethers such as tetrahydrofuran, dioxane and the like. The reaction medium is preferably used in an amount of 20 to 1,000 parts by weight per 100 parts by weight of the reactants.

The temperature for the condensation reaction may appropriately be varied depending upon the reactivities of the reactants though usually is 10° to 200° C., preferably 70° to 150° C.

After the completion of the condensation reaction, in order to remove unreacted materials, the acid catalyst and the reaction medium which remain in the reaction system, the temperature of the reaction system is usually elevated to 130° to 230° C. and the volatile matter is removed by distillation under reduced pressure and the resulting molten novolak is casted on a steel belt or the like and recovered.

The novolak can also be recovered by dissolving the reaction mixture in the above-mentioned hydrophilic solvent after the completion of the condensation reaction; adding the resulting solution to a precipitating agent such as water, n-hexane, n-heptane or the like to precipitate the novolak; and then separating and heat-drying the precipitate.

As the alkali-soluble resins other than the novolaks, there may be used, for example, polyhydroxystyrenes, their derivatives, styrene-maleic anhydride copolymers, polyvinyl hydroxybenzoates and carboxyl group-containing methacrylate resins. These alkali-soluble resins may be used alone or in combination of two or more.

The radiation-sensitive compound used in this invention includes 1,2-quinonediazide compounds and azide compounds.

The 1,2-quinonediazide compound used in obtaining a positive type radiation-sensitive resin composition of this invention is not critical, and includes, for example, 1,2-benzoquinonediazide-4-sulfonic acid esters, 1,2-naphthoquinonediazide-4-sulfonic acid esters, 1,2-naphthoquinonediazide-5-sulfonic acid esters, 1,2-naphthoquinonediazide-6-sulfonic acid esters, 1,2-naphthoquinonediazide-8-sulfonic acid esters and the like. Specific examples of the 1,2-quinonediazide compound are 1,2-quinonediazidesulfonic acid esters of (poly)hydroxybenzenes such as p-cresol-1,2-benzoquinonediazide-4-sulfonic acid ester, resorcinol-1,2-naphthoquinonediazide-4-sulfonic acid ester, pyrogallol 1,2-naphthoquinonediazide-5-sulfonic acid ester and the like; 1,2-quinonediazidesulfonic acid esters of (poly)hydroxyphenyl alkyl ketones or (poly)hydroxyphenyl aryl ketones such as 2,4-dihydroxyphenyl propyl ketone-1,2-benzoquinonediazide-4-sulfonic acid ester, 2,4-dihydroxyphenol n-hexyl ketone-1,2-naphthoquinonediazide-4-sulfonic acid ester, 2,4-dihydroxybenzophenone-1,2-naphthoquinonediazide-5-sulfonic acid ester, 2,3,4-trihydroxyphenyl n-hexyl ketone-1,2-naphthoquinonediazide-4-sulfonic acid ester, 2,3,4-trihydroxybenzophenone-1,2-naphthoquinonediazide-4-sulfonic acid ester, 2,3,4-trihydroxybenzophenone-1,2-naphthoquinonediazide-5-sulfonic acid ester, 2,4,6-trihydroxybenzophenone-1,2-naphthoquinonediazide-4-sulfonic acid ester, 2,4,6-trihydroxybenzophenone-1,2-(naphthoquinonediazide-5-sulfonic acid ester, 2,2',4,4'-tetrahydroxybenzophenone-1,2-naphthoquinonediazide-5sulfonic acid ester, 2,3,4,4'-tetrahydroxybenzophenone-1,2-naphthoquinonediazide-5-sulfonic acid ester, 2,3,4,4'-tetrahydroxybenzophenone-1,2-naphthoquinonediazide-4-sulfonic acid ester, 2,3,4,4'-tetrahydroxybenzophenone-1,2-benzoquinonediazide-4-sulfonic acid ester, 2,3,4,2',6'-pentahydroxybenzophenone-1,2-naphthoquinonediazide-5-sulfonic acid ester, 2,4,6,3',4',5'-hexahydroxybenzophenone-1,2-naphthoquinonediazide-5-sulfonic acid ester and the like; 1,2-quinonediazidesulfonic acid esters of bis[(poly)hydroxyphenyl]alkanes such as bis(p-hydroxyphenyl)methane-1,2-naphthoquinonediazide-4-sulfonic acid ester, bis(2,4-dihydroxyphenyl)methane-1,2-naphthoquinonediazide-5-sulfonic acid ester, bis(2,3,4-trihydroxyphenyl)methane-1,2-naphthoquinonediazide-5-sulfonic acid ester, 2,2-bis(p-hydroxyphenyl)propane-1,2-naphthoquinonediazide-4-sulfonic acid ester, 2,2-bis(2,4-dihydroxyphenyl)-propane-1,2-naphthoquinonediazide-5-sulfonic acid ester, 2,2-bis(2,3,4-trihydroxyphenyl)propane-1,2-naphthoquinonediazide-5-sulfonic acid ester and the like; 1,2-quinonediazidesulfonic acid esters of alkyl (poly)hydroxybenzoates or aryl (poly)hydroxybenzoates such as lauryl 3,5-dihydroxybenzoate-1,2-naphthoquinonediazide-4-sulfonic acid ester, phenyl 2,3,4-trihydroxybenzoate-1,2-naphthoquinonediazide-5-sulfonic acid ester, propyl 3,4,5-trihydroxybenzoate-1,2-naphthoquinonediazide-5-sulfonic acid ester, phenyl 3,4,5-trihydroxybenzoate-1,2-naphthoquinonediazide-5-sulfonic acid ester and the like; 1,2-quinonediazidesulfonic acid esters of bis[(poly)hydroxybenzoyl]alkanes or bis[(poly)hydroxybenzoyl]benzenes such as bis(2,5-dihydroxybenzoyl)methane-1,2-naphthoquinonediazide-4-sulfonic acid ester, bis(2,3,4-trihydroxybenzoyl)methane-1,2-naphthoquinonediazide-5-sulfonic acid ester, bis(2,4,6-trihydroxybenzoyl)methane-1,2-naphthoquinonediazide-5-sulfonic acid ester, p-bis(2,5-dihydroxybenzoyl)benzene-1,2-naphthoquinonediazide-4-sulfonic acid ester, p-bis(2,3,4-trihydroxybenzoyl)benzene-1,2-naphthoquinonediazide-5-sulfonic acid ester, p-bis(2,4,6-trihydroxybenzoyl)benzene-1,2-naphthoquinonediazide-5-sulfonic acid ester and the like; 1,2-quinonediazidesulfonic acid esters of (poly)ethylene glycol di[(-poly)hydroxybenzoates]such as ethylene glycol di(3,5-dihydroxybenzoate)-1,2-naphthoquinonediazide-5-sulfonic acid ester, polyethylene glycol di(3,4,5-trihydroxybenzoate)-1,2-naphthoquinonediazide-5-sulfonic acid ester and the like; 1,2-quinonediazidesulfonic acid esters of alpha-pyrone type natural coloring matters having hydroxyl groups; 1,2-quinonediazidesulfonic acid esters of gamma-pyrone type natural coloring matters having hydroxyl groups; and 1,2-quinonediazidesulfonic acid esters of diazine type natural coloring matters having hydroxyl groups. Besides the 1,2-quinonediazide compounds exemplified above, there can also be used 1,2-quinonediazide compounds described in J. Kosar, "Light-Sensitive Systems", 339–352, (1965), John Wiley & Sons (New York) or in S. De Forest, "Photoresist", 50, (1975), MacGraw-Hill, Inc. (New York).

When, of all the 1,2-quinonediazide compounds mentioned above, 1,2-quinonediazidesulfonic acid esters of polyhydroxy compounds having at least 3 hydroxyl groups, preferably at least 4 hydroxyl groups, in the molecule are used, the effect of the monooxycarboxylic acid esters used in this invention is remarkably exhibited.

Among these 1,2-naphthoquinonediazide compounds, preferred are 2,3,4-trihydroxybenzophenone-1,2-naphthoquinonediazide-5-sulfonic acid ester, 2,3,4,4'-tetrahydroxybenzophenone-1,2-naphthoquinonediazide-5-sulfonic acid ester, 2,2',4,4'-tetrahydroxybenzophenone-1,2-naphthoquinonediazide-5-sulfonic acid ester, ethylene glycol-di(3,4,5-trihydroxybenzoate)-1,2-naphthoquinonediazide-5-sulfonic acid ester, quercetin-1,2-naphthoquinonediazide-5-sulfonic acid ester and the like.

These 1,2-quinonediazide compounds may be used alone or in combination of two or more.

The amount of the 1,2-quinonediazide compound incorporated into the radiation-sensitive resin composition of this invention is usually 5 to 100 parts by weight, preferably 10 to 50 parts by weight, based on 100 parts by weight of the alkali-soluble resin. When the amount is less than 5 parts by weight, the 1,2-quinonediazide compound absorbs the radiation applied, and hence, the amount of the carboxylic acid formed becomes insufficient, resulting in a difficulty in patterning. When the amount exceeds 100 parts by weight, the irradiation with a radiation in a short time does not enable the whole of the 1,2-quinonediazide compound to be decomposed, resulting in a difficulty in sufficient development with a developer consisting of an aqueous alkaline solution.

The kind of the azide compound used in obtaining a negative type radiation-sensitive resin composition of this invention is not critical. The usable azide compound includes, for example, 4,4'-diazidostilbene, 4,4'-diazidostilben disulfone, p-phenylenebisazide, 4,4'-diazidobenzophenone, 4,4'-diazidodiphenyl methane, 4,4'-diazidochalcone, 2,6-bis(4'-azidobenzal)cyclohexanone, 2,6-bis(4'-azidobenzal)-4-methylcyclohexanone, 4,4'-diazidodiphenyl, 4,4'-diazido-3,3'-dimethyldiphenyl, 2,7-diazidofluorene, 4,4'-diazidodibenzyl, 4,4,'-diazidophenyl disulfide, 4,4'-diazidophenyl ether, 3,3'-dichloro-4,4'-diazidodiphenylmethane, 3,3'-diazidophenyl sulfone, 4,4'-diazidophenyl sulfone, 4,4'-diazidophenyl sulfide and the like.

These azide compounds may be used alone or in combination of two or more.

The amount of the azide compound incorporated into the radiation-sensitive resin composition of this invention is usually 3 to 100 parts by weight, preferably 5 to 50 parts by weight, based on 100 parts by weight of the alkali-soluble resin. When the amount is less than 3 parts by weight, patterning is difficult. When the amount exceeds 100 parts by weight, the coating of the resulting radiation-sensitive resin composition on a substrate becomes difficult.

The radiation-sensitive resin composition of this invention can contain a sensitizer in order to improve its sensitivity as a resist. The sensitizer includes 2H-pyrido[3,2-]-1,4-oxazin-3[4H]-ones, 10H-pyrido[3,2-b][1,4]-benzothiazines, urazols, hydantoins, barbituric acids, glycine anhydrides, 1-hydroxybenzotriazoles, alloxans, maleimides and sensitizers described in Japanese Patent Publication No. 12,242/73, Japanese Patent Publication No. 35,402/73, Japanese Patent Application Kokai (Laid-Open) No. 37,641/83, Japanese Patent Application Kokai (Laid-Open) No. 149,042/83, etc. The amount of the sensitizer incorporated into the radiation sensitive resin composition of this invention is usually 1 to 100 parts by weight, preferably 4 to 60 parts by weight, based on 100 parts by weight of the 1,2-quinonediazide compound.

The radiation-sensitive resin composition of this invention can further contain a surfactant or the like in order to improve the coatability and striation of the radiation-sensitive resin composition as well as the developability of the radiation-exposed or radiation-unexposed portions after the formation of the dry coating. The usable surfactant includes, for example, nonionic surfactants such as polyoxyethylene alkyl ethers (e.g., polyoxyethylene lauryl ether, polyoxyethylene stearyl ether, polyoxyethylene oleyl ether and the like), polyoxyethylene alkyl phenol ethers (e.g., polyoxyethylene octyl phenol ether, polyoxyethylene nonyl phenol ether and the like), polyethylene glycol aliphatic diesters (e.g., polyethylene glycol dilaurate, polyethylene glycol distearate and the like); fluorine-containing surfactants such as F Top EF 301, EF 303 and EF 352 (these are products of Shin Akita Kasei K. K.), Megafac F 171 and F 173 (these are products of DAINIPPON INK & CHEMICALS), Fluorad FC 430 and FC 431 (these are products of Sumitomo 3M Limited), Asahi Guard AG 710 and Surflon S-382, SC 101, SC 102, SC 103, SC 104, SC 105 and SC 106 (these are products of Asahi Glass Co., Ltd.), and strait chain-like fluorine-containing surfactants having fluorinated alkyl groups or perfluoroalkyl groups as described in Japanese Patent Application Kokai (Laid-Open) No. 178,242/82; organosiloxane polymer KP 341 (a product of Shin-Etsu Chemical Co., Ltd.); and acrylic or methacrylic (co)polymer Polyflow No. 75 and No. 95 (these are products of Kyoeisha Yushikagaku Kogyo K. K.). These surfactants can be used alone or in combination of two or more. The amount of the surfactant incorporated into the radiation-sensitive resin composition of this invention is usually 2% by weight or less, preferably 1% by weight or less, based on the weight of the solids content of the composition.

The radiation-sensitive resin composition of this invention can further contain a dye or a pigment in order to visualize the resist image of the radiation-exposed or -unexposed portions or to reduce the adverse effect of halation when irradiating with a radiation, as well as an adhesion aid in order to improve the adhesiveness to substrate.

The radiation-sensitive resin composition of this invention can also contain, if necessary, a storage stabilizer, a defoaming agent and the like.

The radiation-sensitive resin composition of this invention can be prepared by dissolving, in a solvent comprising a monooxymonocarboxylic acid ester, the predetermined amounts of an alkali-soluble resin, a radiation-sensitive compound and optionally various additives and then filtering the resulting solution through a filter having a pore diameter of, for example, about 0.2 μm.

The usable developer for the radiation-sensitive resin composition of this invention includes aqueous alkaline solutions of inorganic alkalis (e.g., sodium hydroxide, potassium hydroxide, sodium carbonate, sodium silicate, sodium metasilicate, ammonia and the like), primary amines (e.g., ethylamine, n-propylamine and the like), secondary amines (e.g., diethylamine, di-n-propylamine and the like), tertiary amines (e.g., triethylamine, methyldiethylamine and the like), alcohol amines (e.g., dimethylethanolamine, triethanolamine and the like), quaternary ammonium salts (e.g., tetramethylammonium hydroxide, tetraethylammonium hydroxide and the like), and cyclic amines (e.g., pyrrole, piperidine, 1,8-diazabicyclo(5,4,0)-7-undecene, 1,5-diazabicyclo(4,3,0)-5-nonane and the like). The use of an aqueous solution of a quaternary ammonium salt or a cyclic amine is preferred in the production of integrated circuits objecting to the use of a metal-containing developer.

The developer can contain an appropriate amount of a water-soluble organic solvent (e.g., methanol, ethanol or the like) or a surfactant.

According to this invention, by dissolving an alkali-soluble resin and a radiation-sensitive compound in a specific solvent, the number of the fine particles formed can be reduced, whereby it is made possible to obtain a radiation-sensitive resin composition, the resist performance of which is hardly altered, and this effect is particularly remarkable in the case of a positive type radiation-sensitive resin composition.

DESCRIPTION OF PREFERRED EMBODIMENTS

This invention will be described in further detail below by way of Examples. However, this invention should not be interpreted to be restricted to these Examples.

EXAMPLE 1

Under shading the light, in a 2-liter separable flask equipped with a stirrer were placed 244 g of a novolak obtained by addition condensation of a cresol mixture (m-cresol/p-cresol=6/4 by weight) and formaldehyde, 56 g of ethylene glycol di(3,4,5-trihydroxybenzoate)-1,2-naphthoquinonediazide-5-sulfonic acid pentaester and 900 g of ethyl 2-hydroxypropionate. The resulting mixture was stirred to form a solution. The solution was then filtered through a membrane filter having a pore diameter of 0.2 μm, and the filtrate was filled in two 500-ml glass bottles, whereby a positive type radiation-sensitive resin composition was prepared. Immediately after the preparation, the composition was subjected to measurement of the number of fine particles contained therein, using an automatic fine-particles measurement tester manufactured by HIAC/ROYCO. The number of fine particles having particle diameters of at least 0.5 μm was 15 per ml of the composition.

The positive type radiation-sensitive resin composition prepared above was coated on a silicon wafer having a silicon oxide film using a spinner. The resulting coated wafer was subjected to prebaking for 25 minutes at 90° C. in an oven to form a resist layer of 1.2 μm in thickness. Then, a test pattern mask (a product of TOPPAN PRINTING CO., LTD.) was attached to the resist layer. Using an ultrahigh pressure mercury lamp as a light source, ultraviolet rays were applied to the resist layer through a test pattern mask, and the coated wafer was subjected to development for 60 seconds using an aqueous solution containing 2.4% by weight of tetramethylammonium hydroxide, whereby a pattern having a line width of 1.0 μm could be resolved. The yield of residual film thickness at the unexposed portion was 95%.

In the same manner as above, a resist pattern was formed on a silicon wafer having a silicon oxide film. The resist pattern was subjected to post-baking for 30 minutes at 130° C. and then to etching for 10 minutes at 25° C. using an etchant which was a 1:6 (by volume) mixture of 49% HF and 40% $NH_4F$. The resist was stripped off and the pin hole density on the wafer was measured. The pin hole density was 0.1 flaw/$cm^2$. The pin hole density was determined by measuring the density of the flaws caused on the substrate by the pin holes of the resist.

Separately, the above positive type radiation-sensitive resin composition filled in a 500-ml glass bottle was stored for 1 month in a constant temperature bath kept at 40° C. After the storage, the composition contained no fine particle when visually checked, and the number of fine particles as measured by the automatic fine-particles measurement tester was 10 per ml of the composition and there was substantially no increase in the number. This composition after the storage was evaluated for the performance as a resist in the same manner as done for the composition immediately after the preparation. As a result, there was no change in sensitivity and yield of residual film thickness, and there was substantially no change in pin hole density (the pin hole density was 0.08 flaw/cm$^2$). This indicates an excellent storage stability of the composition.

COMPARATIVE EXAMPLE 1

A positive type radiation-sensitive resin composition was prepared by repeating the same procedure as in Example 1, except that the solvent used in Example 1 (ethyl 2-hydroxypropionate) was replaced by methyl cellosolve acetate. Immediately after the preparation, the composition contained 8 fine particles having pore diameters of at least 0.5 μm per ml of the composition, and its pin hole density was 0.1 flaw/cm$^2$. This composition was stored for 1 month at 40° C. in the same manner as in Example 1. After the storage, the composition contained no fine particle when visually checked, but the number of particles having particle diameters of at least 0.5 μm as measured by the automatic fine particles measurement tester increased to 1,000 per ml of the composition. Also, the pin hole density increased to 2.0 flaws/cm$^2$.

EXAMPLES 2 to 6

Positive type radiation-sensitive resin compositions were prepared by repeating the same procedure as in Example 1, except that the solvent used in Example 1 (ethyl 2-hydroxypropionate) was replaced by one of those shown in Table 1. On each composition, immediately after the preparation and after 1 month storage at 40° C., the number of fine particles having particle diameters of at least 0.5 μm and the pin hole density were measured in the same manner as in Example 1. The results indicate that none of the solvents used caused an increase in the number of fine particles and pin hole density. The results are shown in Table 1.

The resist performance of each composition was the same as in Example 1.

TABLE 1

| Example No. | Solvent | Number of fine particles (particles/ml) | | Pin hole density (flaws/cm$^2$) | |
|---|---|---|---|---|---|
| | | Immediately after preparation | After 1-month storage at 40° C. | Immediately after preparation | After 1-month storage at 40° C. |
| 2 | Methyl 2-hydroxypropionate | 5 | 8 | 0.12 | 0.3 |
| 3 | Ethyl 2-hydroxy-2-methylpropionate | 8 | 7 | 0.15 | 0.13 |
| 4 | Methyl 2-hydroxy-3-methylbutanoate | 7 | 11 | 0.1 | 0.15 |
| 5 | Ethyl hydroxyacetate | 5 | 5 | 0.12 | 0.12 |
| 6 | Ethyl ethoxyacetate | 10 | 10 | 0.14 | 0.16 |

EXAMPLES 7 to 13

Positive type radiation-sensitive resin compositions were prepared by repeating the same procedure as in Example 1, except that the 1,2-quinonediazide compound used in Example 1 was replaced by one of those shown in Table 2. On each composition, immediately after the preparation and after the 1-month storage at 40° C., the number of fine particles having particle diameters of at least 0.5 μm and the pin hole density were measured in the same manner as in Example 1. The results indicate that none of the 1,2-quinonediazide compounds used caused an increase in the number of fine particles and pin hole density as can be seen from Table 2. Each composition gave no difference in resist performance (sensitivity and yield of residual film thickness) between immediately after the preparation and after the 1-month storage at 40° C.

TABLE 2

| Example No. | 1,2-Quinonediazide compound | Number of fine particles (particles/ml) | | Pin hole density (flaws/cm$^2$) | |
|---|---|---|---|---|---|
| | | Immediately after preparation | After 1-month storage at 40° C. | Immediately after preparation | After 1-month storage at 40° C. |
| 7 | Bis(2,4-dihydroxyphenyl)-methane-1,2-naphthoquinone-diazide-5-sulfonic acid tetraester | 10 | 8 | 0.1 | 0.09 |
| 8 | 2,2-Bis(2,3,4-trihydroxyphenyl)propane-1,2-naphthoquinonediazide-5-sulfonic acid pentaester | 8 | 9 | 0.16 | 0.13 |
| 9 | Morin-1,2-naphthoquinonediazide-5-sulfonic acid tetraester | 9 | 9 | 0.11 | 0.15 |
| 10 | 2,2',4,4'-Tetrahydroxybenzophenone-1,2-naphthoquinonediazide-5-sulfonic acid tetraester | 10 | 11 | 0.12 | 0.14 |
| 11 | Quercetin-1,2-naphthoquinonediazide-5-sulfonic acid tetraester | 10 | 11 | 0.1 | 0.1 |
| 12 | 1,8-Bis(2,3,4-trihydroxybenzoyl)octane-1,2-naphtho- | 7 | 9 | 0.14 | 0.13 |

TABLE 2-continued

| Example No. | 1,2-Quinonediazide compound | Number of fine particles (particles/ml) | | Pin hole density (flaws/cm²) | |
|---|---|---|---|---|---|
| | | Immediately after preparation | After 1-month storage at 40° C. | Immediately after preparation | After 1-month storage at 40° C. |
| 13 | quinonediazide-5-sulfonic acid pentaester 2,3,4,4'-Tetrahydroxybenzophenone-1,2-naphthoquinonediazide-5-sulfonic acid triester | 8 | 10 | 0.12 | 0.11 |

EXAMPLE 14

Under shading the light, in a 2-liter separable flask equipped with a stirrer were placed 244 g of a novolak obtained by addition condensation of a cresol mixture (m-cresol/p-cresol=6/4 by weight) and formaldehyde, 49 g of 4,4'-diazidophenyl sulfone and 900 g of ethyl 2-hydroxypropionate. The resulting mixture was stirred to form a solution. The solution was then filtered through a membrance filter having a pore diameter of 0.2 μm, and two 500-ml glass bottles were filled with the filtrate, whereby a negative type radiation-sensitive resin composition was prepared. Immediately after the preparation, the number of fine particles contained in the composition was measured in the same manner as in Example 1. The number of fine particles having particle diameters of at least 0.5 μm was 12 per ml of the composition.

The negative-type radiation-sensitive resin composition prepared above was coated on a silicon wafer using a spinner. The resulting coated wafer was subjected to prebaking for 25 minutes at 90° C. to form a resist layer. Then, a test pattern mask (a product of TOPPAN PRINTING CO., LTD.) was attached to the resist layer. Using a xenon-mercury lamp of 1 KW as a light source, far-ultraviolet rays were applied to the resist layer through the test pattern mask, and the coated wafer was subjected to development for 60 seconds using an aqueous solution containing 4.2% by weight of tetramethylammonium hydroxide, whereby a pattern having a line width of 1.1 μm could be resolved. The yield of residual film thickness was 95%.

In the same as above, a resist pattern was formed on a silicon wafer having a silicon oxide film. The resist pattern was subjected to post-baking for 30 minutes at 130° C. and then to etching for 10 minutes at 25° C. using an etchant which was a HF (49%)/NH₄F (40%) (1:6 by volume) mixture. The resist was stripped off and the pin hole density on the wafer was measured. The pin hole density was 0.1 flaw/cm².

Separately, the thus prepared negative type radiation-sensitive resin composition was placed in a 500-ml glass bottle and stored for 1 month in a constant temperature bath kept at 40° C. After the storage, the composition contained no fine particle when visually checked, and the number of fine particles as measured by the automatic fine-particles measurement tester was 18 per ml of the composition and there was substantially no increase in the number. After the storage of the composition, the evaluation as a resist was made in the same manner as in the case of the composition immediately after the preparation. As a result, no change in sensitivity and yield of residual film thickness was observed, and substantially no change in pin hole density (the pin hole density was 0.15 flaw/cm²) was seen.

COMPARATIVE EXAMPLE 2

A negative type radiation-sensitive resin composition was prepared by repeating the same procedure as in Example 14, except that the solvent used in Example 14 (ethyl 2-hydroxypropionate) was replaced by methyl cellosolve acetate. Immedaitely after the preparation, the composition was subjected to measurement of number of fine particles having particle diameters of at least 0.5 μm as well as the measurement of pin hole density, in the same manner as in Example 14. The number of fine particles was 15 per ml of the composition and the pin hole density was 0.1 flaw/cm². This composition was stored for 1 month at 40° C. in the same manner as in Example 14. After the storage, the number of fine particles having particle diameters of at least 0.5 μm increased to 1,500 per ml of the composition, and the pin hole density increased to 1.7 flaws/cm².

EXAMPLE 15

A negative type radiation-sensitive resin composition was prepared by repeating the same procedure as in Example 14, except that the azide compound used in Example 14 (4,4'-diazidophenyl sulfone) was replaced by 40 g of 2,6-bis(4'-azidobenzal)-4-methylcyclohexanone. On the composition immediately after the preparation, the number of fine particles having particle diameters of at least 0.5 μm was measured in the same manner as in Example 14. The number of fine particles having particle diameters of at least 0.5 μm 10 was per ml of the composition.

The radiation-sensitive resin composition thus prepared was coated on a silicon wafer using a spinner. The resulting coated wafer was subjected to prebaking for 25 minutes at 90° C. to form a resist film. Then, a test pattern mask (a product of TOPPAN PRINTING CO., LTD.) was attached to the resist film. Using PLA 501-F (a product of CANON INC.) as a light source, ultraviolet rays were applied to the resist film through the test pattern mask, and the coated wafer was subjected to development for 60 seconds using an aqueous solution containing 3.5% by weight of tetramethylammonium hydroxide, whereby a pattern having a line width of 1.1 μm could be resolved. The yield of residual film thickness was 97%.

The composition was also subjected to measurement of pin hole density in the same manner as in Example 14. The density was 0.15 flaw/cm².

The composition was stored for 1 month at 40° C. in the same manner as in Example 14. After the storage, in the same manner as in Example 14, the number of fine particles having particle diameters of at least 0.5 μm and the pin hole density were measured. The number of fine particles having particle diameters of at least 0.5 μm and the pin hole density were 17 per ml of the composition and 0.12 flaw/cm², respectively. It is seen that these data are substantially the same as those immediately after the preparation.

immediately after the preparation and after 1-month storage at 40° C.

TABLE 4

| Example No. | Azide compound | Number of fine particles (particles/ml) | | Pin hole density (flaws/cm²) | |
|---|---|---|---|---|---|
| | | Immediately after preparation | After 1-month storage at 40° C. | Immediately after preparation | After 1-month storage at 40° C. |
| 21 | 4,4'-Diazidodiphenylmethane | 13 | 23 | 0.1 | 0.1 |
| 22 | 4,4'-Diazidodibenzyl | 12 | 19 | 0.1 | 0.15 |
| 23 | 4,4'-Diazidodiphenyl sulfide | 16 | 25 | 0.1 | 0.1 |
| 24 | 4,4'-Diazidophenyl ether | 10 | 21 | 0.15 | 0.15 |
| 25 | 4,4'-Diazidodiphenyl disulfide | 10 | 18 | 0.12 | 0.14 |

EXAMPLE 16 to 20

Negative type radiation-sensitive resin compositions were prepared by repeating the same procedure as in Example 14, except that the solvent was changed from ethyl 2-oxypropionate to one of those shown in Table 3. On the composition immediately after the preparation and after 1-month storage at 40° C., the number of fine particles having particle diameters of at least 0.5 μm and the pin hole density were measured in the same manner as in Example 14, to obtain the results shown in Table 3. As is clear from Table 3, none of the solvents used caused deterioration of performance due to storage.

The resist performance of each composition was similar to that in Example 14.

TABLE 3

| Example No. | Solvent | Number of fine particles (particles/ml) | | Pin hole density (flaws/cm²) | |
|---|---|---|---|---|---|
| | | Immediately after preparation | After 1-month storage at 40° C. | Immediately after preparation | After 1-month storage at 40° C. |
| 16 | Methyl 2-hydroxypropionate | 15 | 23 | 0.1 | 0.12 |
| 17 | Ethyl 2-hydroxy-2-methylpropionate | 10 | 16 | 0.1 | 0.1 |
| 18 | Ethyl ethoxyacetate | 13 | 20 | 0.13 | 0.15 |
| 19 | Ethyl hydroxyacetate | 10 | 16 | 0.15 | 0.14 |
| 20 | Methyl 2-hydroxy-3-methylbutanoate | 10 | 15 | 0.1 | 0.1 |
| 21 | 4,4'-Diazidodiphenylmethane | 13 | 23 | 0.1 | 0.1 |
| 22 | 4,4'-Diazidodibenzyl | 12 | 19 | 0.1 | 0.15 |
| 23 | 4,4'-Diazidodiphenyl sulfide | 16 | 25 | 0.1 | 0.1 |
| 24 | 4,4'-Diazidophenyl ether | 10 | 21 | 0.15 | 0.15 |
| 25 | 4,4'-Diazidodiphenyl disulfide | 10 | 18 | 0.12 | 0.14 |

EXAMPLES 21 to 25

Negative type radiation-sensitive resin compositions were prepared by repeating the same procedure as in Example 14, except that the azide compound used in Example 14 (4,4-diazidophenyl) was replaced by one of those shown in Table 4. On these compositions immediately after the preparation and after 1-month storage at 40° C., the number of fine particles having particle diameters of at least 0.5 μm and the pin hole density were measured in the same manner as in Example 14, to obtain the results shown in Table 4. Each composition showed no difference in resist performance (sensitivity, yield of residual film thickness, resolution, etc.) between immediately after the preparation and after 1-month storage at 40° C.

What is claimed is:

1. A radiation-sensitive resin composition, comprising a solution of 100 parts by weight of an alkali-soluble resin and 5 to 100 parts by weight of a 1,2-quinonediazide compound as a radiation-sensitive compound in a solvent consisting essentially of at least one member selected from the monooxymonocarboxylic acid esters represented by the following formulas:

$$HO-\underset{\underset{CH_3}{|}}{CH}-COOC_2H_5,$$

$$HO-\underset{\underset{CH_3}{|}}{CH}-COOCH_3,$$

$$CH_3O-CH_2CH_2COOCH_3.$$

2. The composition according to claim 1, wherein the monooxycarboxylic acid ester is at least one compound selected from the group consisting of monooxymonocarboxylic acid esters represented by the formulas:

$$HO-\underset{\underset{CH_3}{|}}{CH}-COOC_2H_5 \text{ and}$$

$$HO-\underset{\underset{CH_3}{|}}{CH}-COOCH_3.$$

3. The composition according to claim 1, wherein the alkali-soluble resin is an alkali-soluble novolak resin.

4. The composition according to claim 1, wherein the radiation-sensitive compound is at least one 1,2-quinonediazide compound selected from the group consisting of 1,2-benzoquinonediazide-4-sulfonic acid esters, 1,2-naphthoquinonediazide-5-sulfonic acid esters, 1,2-naphthoquinonediazide-6-sulfonic acid esters and 1,2-naphthoquinonediazide-8-sulfonic acid esters.

5. The composition according to claim 4, wherein the 1,2-quinonediazide compound is a 1,2-quinonediazide sulfonic acid ester of a polyhydroxy compound having at least 3 hydroxyl groups in the molecule.

6. The composition according to claim 1, wherein the 1,2-quinonediazide compound is at least one compound selected from the group consisting of 1,2-quinonediazide sulfonic acid esters of (poly)hydroxybenzenes, 1,2-quinonediazide sulfonic acid esters of (poly)hydroxyphenyl alkyl ketones, 1,2-quinonediazide sulfonic acid esters of (poly)hydroxyphenyl aryl ketones, 1,2-quinonediazide sulfonic acid esters of bis((poly)-hydroxyphenyl)alkanes, 1,2-quinonediazide sulfonic acid esters of alkyl(poly)hydroxybenzoates, 1,2-quinonediazide sulfonic acid esters of aryl (poly)hydroxybenzoates, 1,2-quinonediazide sulfonic acid esters of aryl (poly)ethylene glycol di((poly)hydroxybenzoates), 1,2-quinonediazide sulfonic acid esters of $\gamma$-pyrone natural coloring matters having hydroxy groups, and 1,2-quinonediazide sulfonic acid esters of diazine natural coloring matters having hydroxyl groups.

7. The composition according to claim 1, wherein the solvent consists of the at least one monooxymonocarboxylic acid ester and other solvents, the amount of said other solvents being less than 30% by weight of the total weight of the solvents.

8. The composition according to claim 7, wherein said other solvents are at least one solvent selected from the group consisting of ethers, esters, ketones, fatty acids, alcohols and aromatic hydrocarbons.

* * * * *